United States Patent
Lee et al.

(10) Patent No.: US 10,814,457 B2
(45) Date of Patent: Oct. 27, 2020

(54) GIMBAL FOR CMP TOOL CONDITIONING DISK HAVING FLEXIBLE METAL DIAPHRAGM

(71) Applicant: GLOBALFOUNDRIES INC., Grand Cayman (KY)

(72) Inventors: Sunghoon Lee, Rexford, NY (US); Sung Pyo Jung, Loudonville, NY (US); Eric J. Bodensieck, Schuylerville, NY (US); Aldrin Bernard Anak Vincent Eddy, Halfmoon, NY (US); Dinesh R. Koli, Mechanicville, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 309 days.

(21) Appl. No.: 15/924,792

(22) Filed: Mar. 19, 2018

(65) Prior Publication Data
US 2019/0283215 A1    Sep. 19, 2019

(51) Int. Cl.
| | |
|---|---|
| *B24D 3/34* | (2006.01) |
| *B24B 53/12* | (2006.01) |
| *H01L 21/321* | (2006.01) |
| *H01L 21/304* | (2006.01) |
| *B24B 53/017* | (2012.01) |
| *B24B 37/26* | (2012.01) |

(52) U.S. Cl.
CPC .............. *B24D 3/346* (2013.01); *B24B 53/12* (2013.01); *H01L 21/304* (2013.01); *H01L 21/3212* (2013.01); *B24B 37/26* (2013.01); *B24B 53/017* (2013.01)

(58) Field of Classification Search
CPC ......... B24D 3/346; B24B 53/12; B24B 37/26; B24B 53/017; H01L 21/304; H01L 21/3212
USPC ......................................................... 451/444
See application file for complete search history.

(56) References Cited

U.S. PATENT DOCUMENTS

| 1,844,657 | A | * | 2/1932 | Hinckley | ................. H04R 7/00 |
| | | | | | 181/162 |
| 3,489,381 | A | * | 1/1970 | Jones | .................... G11B 5/6005 |
| | | | | | 248/618 |
| 3,502,857 | A | * | 3/1970 | Cleveland | .............. G01C 17/00 |
| | | | | | 362/23.18 |
| 3,524,355 | A | * | 8/1970 | Duck | ...................... G01C 19/00 |
| | | | | | 74/5 R |
| 6,149,512 | A | | 11/2000 | Wilson et al. | |
| 6,390,902 | B1 | | 5/2002 | Chang et al. | |
| 6,537,144 | B1 | | 3/2003 | Tsai et al. | |
| 6,592,437 | B1 | | 7/2003 | Boyd et al. | |

(Continued)

FOREIGN PATENT DOCUMENTS

| GB | 1148582 A | * | 4/1969 | ............. G01C 19/22 |
| GB | 2312082 A | * | 10/1997 | .......... H05K 1/0253 |

*Primary Examiner* — George B Nguyen
(74) *Attorney, Agent, or Firm* — Francois Pagette; Hoffman Warnick LLC

(57) ABSTRACT

A gimbal for a conditioning system for a CMP tool is configured to maintain a conditioning disk in contact with a polishing pad of the CMP tool. The gimbal includes an arm coupling for coupling to a conditioning swing arm of the CMP tool; and a disk holder for holding the conditioning disk. A flexible diaphragm extends between the arm coupling and the disk holder. The flexible diaphragm allows the disk holder to flex relative to the arm coupling. The flexible diaphragm is made of a metal or metal alloy.

18 Claims, 10 Drawing Sheets

(56) References Cited

U.S. PATENT DOCUMENTS

| | | | |
|---|---|---|---|
| 6,695,680 B2 | 2/2004 | Choi et al. | |
| 6,887,138 B2 | 5/2005 | Bottema et al. | |
| 6,899,604 B2 * | 5/2005 | Togawa | B24B 41/047 |
| | | | 451/443 |
| 6,949,016 B1 | 9/2005 | de la Llera et al. | |
| 7,021,995 B2 | 4/2006 | Toge et al. | |
| 7,066,795 B2 | 6/2006 | Balagani et al. | |
| 2001/0006874 A1 * | 7/2001 | Moore | B24B 49/006 |
| | | | 451/5 |
| 2002/0016136 A1 * | 2/2002 | Birang | B24B 21/04 |
| | | | 451/41 |
| 2004/0203325 A1 | 10/2004 | Dohohue | |
| 2004/0259487 A1 * | 12/2004 | Bottema | B24B 53/017 |
| | | | 451/444 |
| 2005/0032467 A1 * | 2/2005 | Hoshino | B24B 53/017 |
| | | | 451/56 |
| 2008/0090499 A1 * | 4/2008 | Fujita | B24B 29/005 |
| | | | 451/56 |
| 2013/0286800 A1 * | 10/2013 | Ver Meer | G11B 13/04 |
| | | | 369/13.02 |
| 2015/0087212 A1 | 3/2015 | Doering et al. | |
| 2016/0256976 A1 * | 9/2016 | Shinozaki | B24B 27/0084 |
| 2018/0193975 A1 * | 7/2018 | Tsukada | B24B 37/04 |

\* cited by examiner

US 10,814,457 B2

GIMBAL FOR CMP TOOL CONDITIONING DISK HAVING FLEXIBLE METAL DIAPHRAGM

BACKGROUND

The present disclosure relates to integrated circuit (IC) fabrication polishing tools, and more specifically, to a gimbal for a conditioning disk of a chemical mechanical polishing (CMP) tool. The gimbal includes a flexible metal diaphragm, but having similar flexibility, to conventional plastic gimbals but more fatigue resistance.

During integrated circuit (IC) fabrication, surfaces of material layers formed on a semiconductor wafer are periodically planarized. Planarization refers to various processes that make a surface more planar (that is, more flat and/or smooth). Chemical-mechanical-polishing (CMP) is one conventional planarization process that planarizes surfaces with a combination of chemical reactions and mechanical forces.

FIG. 1 shows a schematic view of a prior art CMP tool 10. As shown in FIG. 1, CMP tool 10 includes a rotating platen 12, which rotates in a direction indicated by arrow 14. Platen 12 may be rotated by motors (not shown) mounted thereto and/or via a power transmission (e.g., belts, chains, etc.) coupled thereto. A polishing pad 20 is mounted on platen 12. A semiconductor wafer (not shown) is held by a rotating polishing head 22. CMP tool 10 applies a slurry, including abrasive and corrosive chemical components, over polishing pad 20 to assist in polishing the semiconductor wafer. Rotating polishing head 22 presses against the surface of polishing pad 20, and rotates in a direction indicated by arrow 24. The rotating direction of polishing pad 20 may be in the same direction as rotating polishing head 22. Further, a polishing swing arm 26 moves polishing head 22 side to side along an arc indicated by arrows 30 and 32. Polishing swing arm 26 may also press polishing pad 20 and the semiconductor wafer together. As polishing head 22 with the semiconductor wafer attached thereto swings over and rotates on polishing pad 20, the semiconductor wafer is planarized. That is, as polishing head 22 is rotated with different axes of rotation (that is, not concentric) with the semiconductor wafer, the process removes material and tends to even out any "topography," making the wafer flat and planar.

To continually create a quality polishing and maintain uniformity, polishing pad 20, typically a polyurethane pad, must be conditioned during use or periodically between uses by a conditioning system 36. FIGS. 2 and 3 show side views of a portion of conditioning system 36. Conditioning system 36 includes a conditioning disk 38 held by a gimbal 40 against polishing pad 20. Gimbal 40 may also be referred to as a platen or conditioner flexure. Gimbal 40 is moved side to side along an arc indicated by arrows 42, 44 by a conditioning swing arm 46. Gimbal 40 and conditioning disk 38 also rotates in the direction of arrow 48. Gimbal 40 and platen 22 may be rotated by motors (not shown) mounted at an outer end of respective swing arms 46, 26 and/or via a power transmission (e.g., belts, chains, etc.) extending through the swing arms. CMP tool 10 can thus condition polishing pad 20 via the arcuate motion of conditioning swing arm 46 and rotation of gimbal 40 and conditioning disk 38.

Referring collectively to FIGS. 2-4, in FIGS. 2 and 3, a side view of conditioning system 36 is shown during various stages of operation, and FIG. 4 shows a side view of gimbal 40 for holding conditioning disk 38 (FIGS. 2-3). Gimbal 40 is conventionally a round piece of plastic, such as polytetrafluoroethylene. Gimbal 40 has a coupling 50 at an upper end for attaching to conditioning swing arm 46, i.e., a bearing or motor thereof, and a disk holder 52 at a lower end to hold conditioning disk 38. Gimbal 40 also includes a flexure member 54 coupling the upper end and the lower end thereof. Flexure member 54 is typically made of plastic. As shown best in FIGS. 2 and 3, plastic flexure member 54 maintains conditioning disk 38 in a planar (i.e., horizontal) position relative to polishing pad 20 being conditioned. As shown in FIG. 3, plastic flexure member 54 may flex during operation to maintain conditioning disk 38 in a planar (i.e., horizontal) position relative to polishing pad 20.

One drawback of plastic gimbals is that some CMP tools exhibit frequent fatigue failures. Currently, the indicators for when a gimbal breaks are mainly observationally-based in terms of, for example, trench height increases due to poor conditioning and/or lower barrier material removal rates, in the product wafer, i.e., there is no automated indication system. Consequently, a broken gimbal on a conditioning system can expose product wafer(s) to damage, resulting in product wafer scrap. When a gimbal of a CMP tool has to be repaired, it can create long down times for the CMP tool, and potentially for the overall IC fabrication process. Another approach to maintaining contact between polishing pad and conditioning disk employs a gimbal surface between two mating and cooperating concave-convex metal surfaces. This approach requires precision machining between the two metal surfaces which can be expensive to make. Further, this approach limits the accommodation of irregularities between polishing pad and conditioning disk to that designed into the mating metal surfaces.

SUMMARY

A first aspect of the disclosure is directed to a gimbal configured to maintain a conditioning disk in contact with a polishing pad of a chemical mechanical planarization (CMP) tool, the gimbal comprising: an arm coupling for coupling to a conditioning swing arm of the CMP tool; a disk holder for holding the conditioning disk; and a flexible diaphragm extending between the arm coupling and the disk holder, the flexible diaphragm allowing the disk holder to flex relative to the arm coupling, wherein the flexible diaphragm is made of a metal or metal alloy.

A second aspect of the disclosure includes a conditioning system for a polishing pad of a chemical mechanical planarization (CMP) tool, the conditioning system comprising: a conditioning swing arm configured to swing and rotate a conditioning disk in contact with the polishing pad; and a gimbal configured to maintain the conditioning disk in contact with the polishing pad, the gimbal including an arm coupling for coupling to the conditioning swing arm, a disk holder for holding the conditioning disk, and a flexible diaphragm extending between the arm coupling and the disk holder, the flexible diaphragm allowing the disk holder to flex relative to the arm coupling, wherein the flexible diaphragm is made of a metal or metal alloy.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a conditioning system for a polishing pad of a CMP tool, and a gimbal for the conditioning system. The conditioning system includes, among other things, a gimbal configured to maintain a conditioning disk in contact with the polishing pad of the CMP tool. The gimbal includes a flexible diaphragm that is made of a metal or metal alloy such that it is much more fatigue resistant than a plastic-based gimbal, yet provides the desired flexibility to maintain contact between the conditioning disk and polishing pad.

Figure 1:
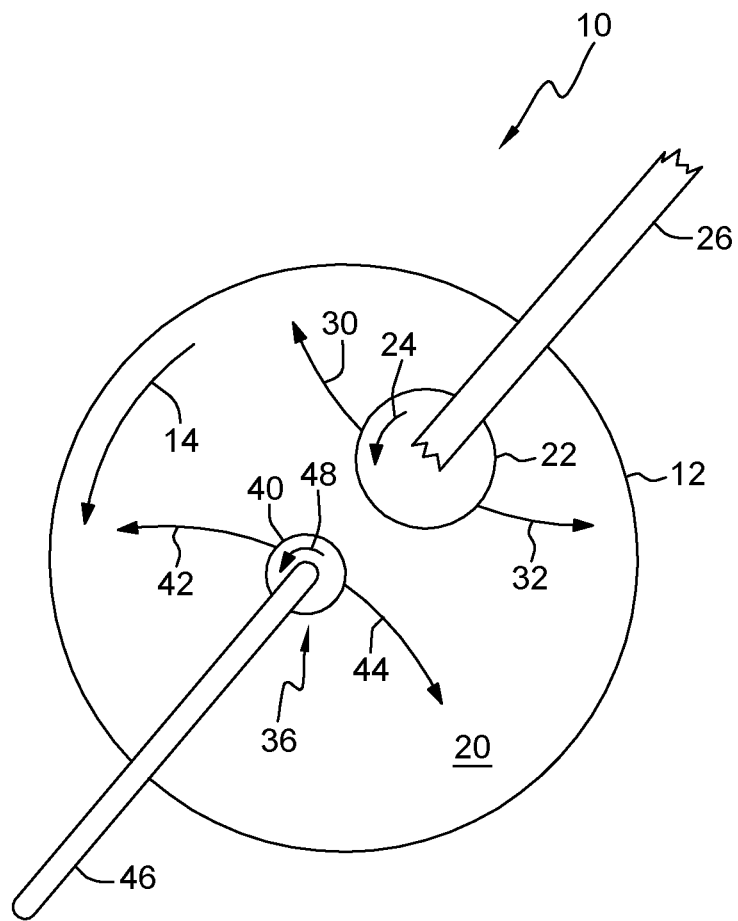
FIG. 1 shows a schematic view of a conventional CMP tool.
Figure 2:
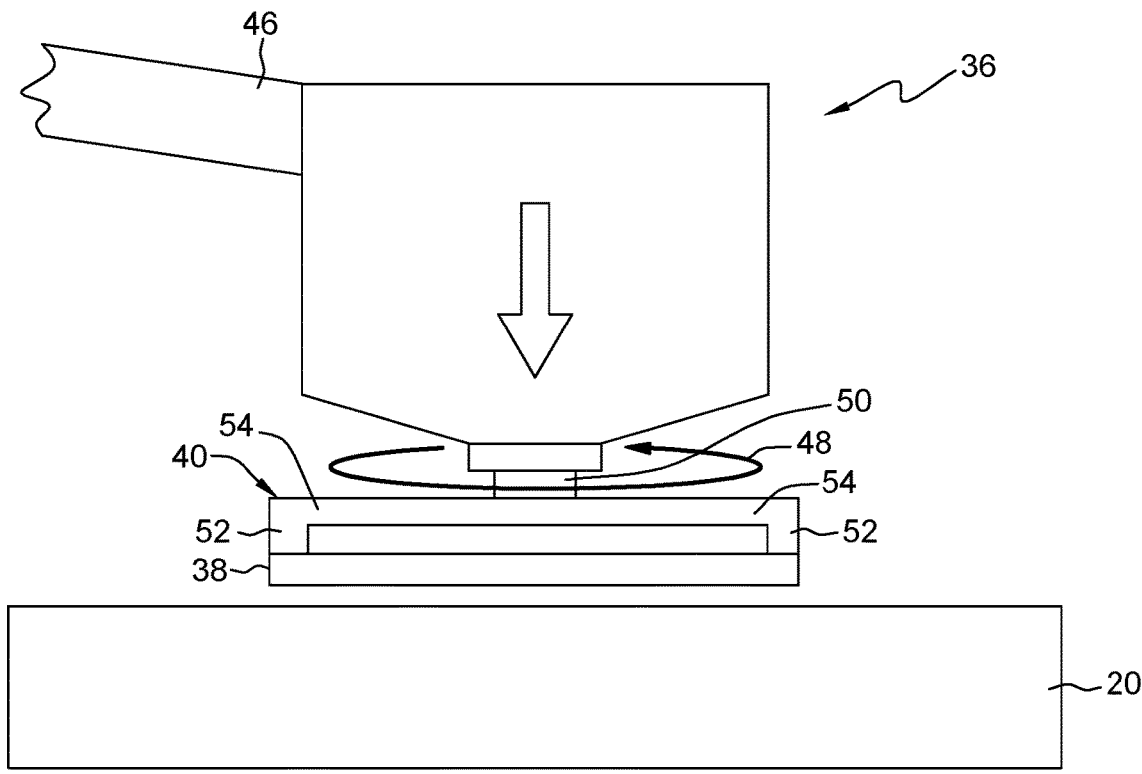
FIG. 2 shows a side view of a conventional conditioning system for a CMP tool.
Figure 3:
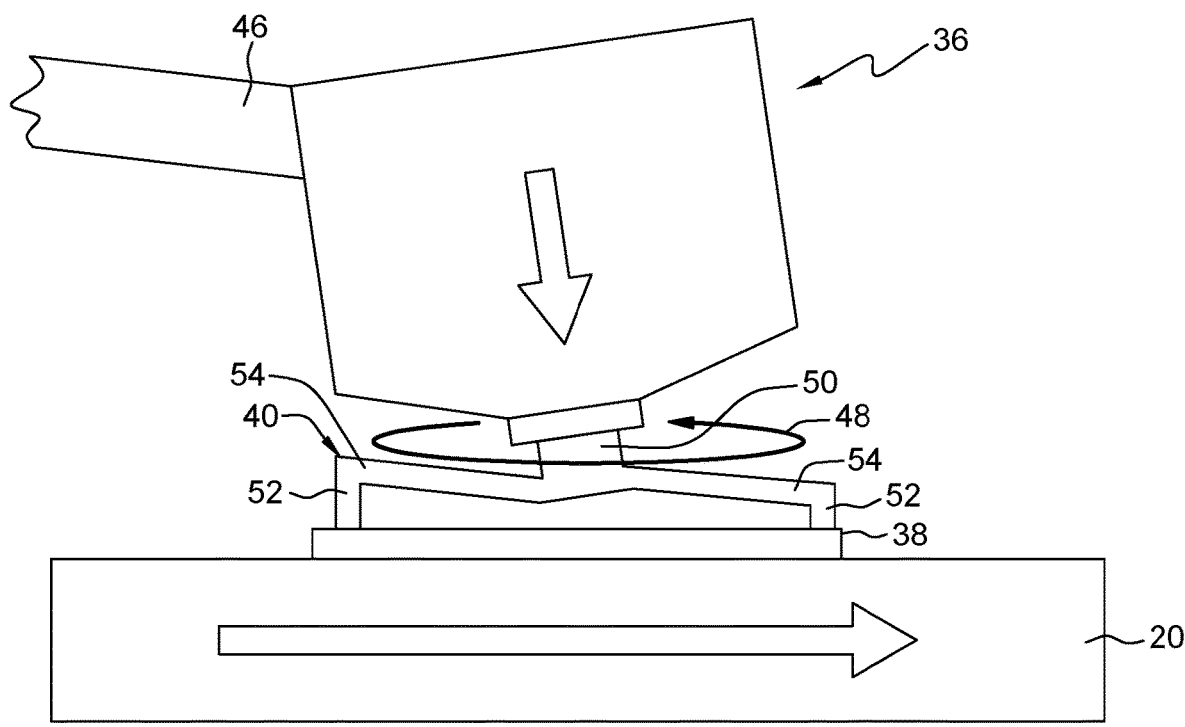
FIG. 3 shows a side view of a conventional conditioning system for a CMP tool, with a flexed gimbal.
Figure 4:
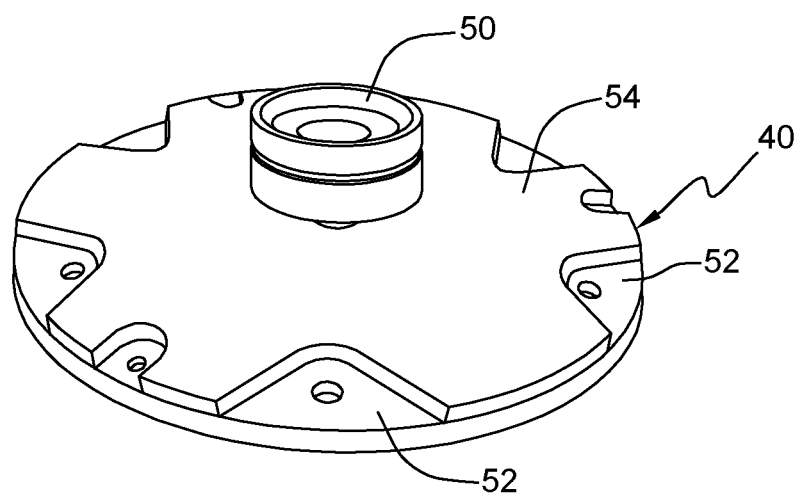
FIG. 4 shows a conventional gimbal for a conditioning system including a plastic flexure member.
Figure 5:
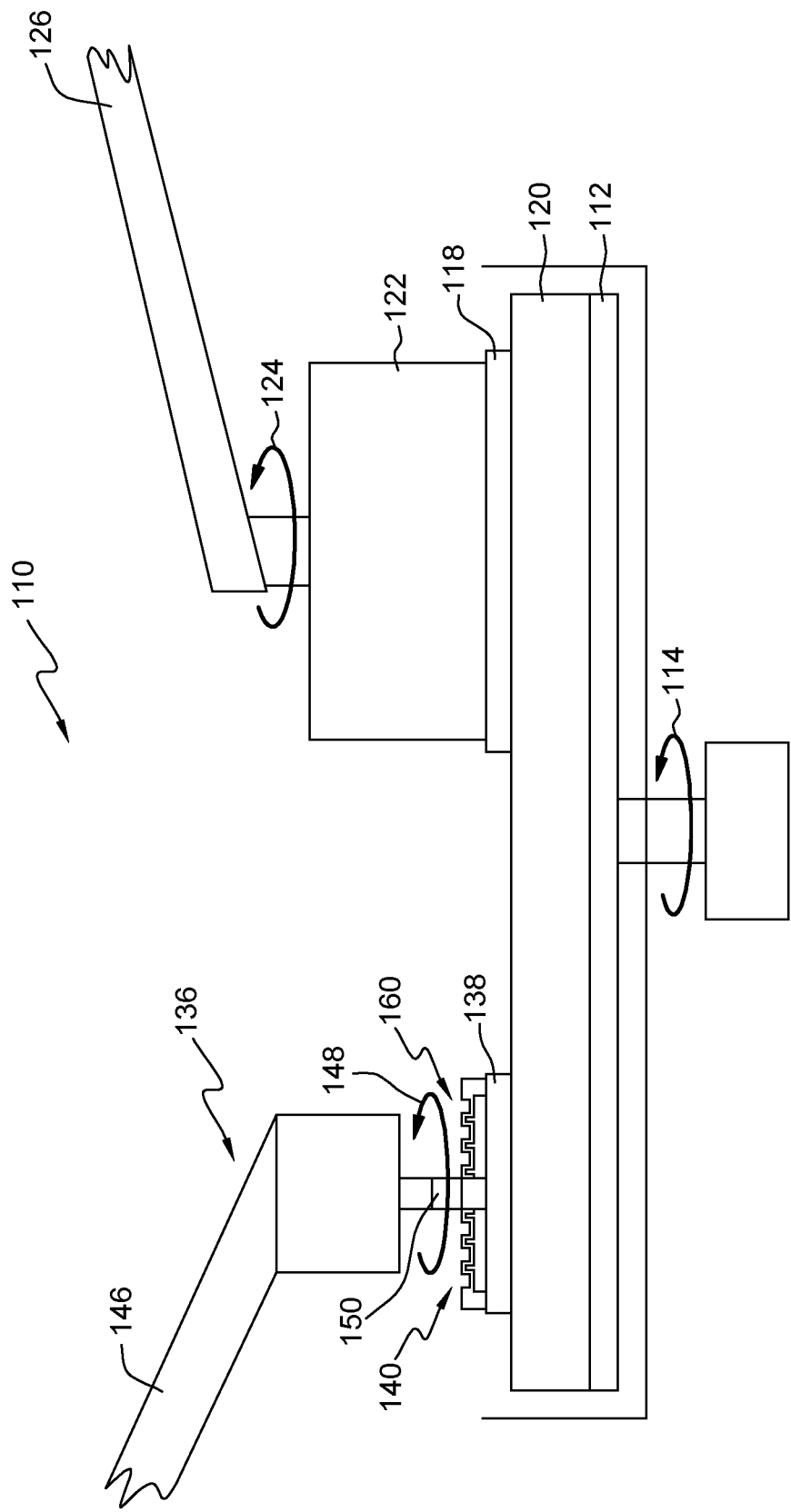
FIG. 5 shows a side view of a CMP tool including a conditioning system, according to embodiments of the disclosure.

Referring to FIG. 5, a schematic side view of a CMP tool 110 is shown. CMP tool 110 includes a rotating platen 112, which rotates in a direction indicated by arrow 114. A polishing pad 120 is mounted relative to platen 112 in any now known or later developed fashion. Polishing pad 120 may include any now known or later developed material for semiconductor wafer polishing such as but not limited to polyurethane. A semiconductor wafer 118 is held by a rotating polishing head 122. CMP tool 110 applies a slurry (not shown), including abrasive and corrosive chemical components, over polishing pad 120 to assist in polishing of semiconductor wafer 118. Rotating polishing head 122 rotates in a direction indicated by arrow 124. The rotating direction of polishing pad 120 may be in the same direction as rotating polishing head 122. A polishing swing arm 126 moves polishing head 122 side to side along an arc into and out of the page. Polishing swing arm 126 may also press polishing pad 120 and semiconductor wafer 118 together in a known fashion. As polishing pad 120 swings over and rotates on polishing pad 120, semiconductor wafer 118 is planarized. That is, as polishing head 120 is rotated with different axes of rotation (that is, not concentric) with semiconductor wafer 118, the process removes material and tends to even out any "topography," making the wafer flat and planar.

As noted, to continually create a quality polishing and maintain uniformity, polishing pad 120 must be conditioned during use or periodically between uses by a conditioning system 136. Conditioning system 136 includes a conditioning disk 138 held by a gimbal 140 against polishing pad 120. Conditioning disk 138 may include any now known or later developed material(s) for conditioning, e.g., cleaning, planarizing, etc., polishing pad 120. Gimbal 140 is configured to maintain conditioning disk 138 in contact with polishing pad 120. Gimbal 140 is moved side to side along an arc (into and out of page) by a conditioning swing arm 146, e.g., powered by any form of drive system. Gimbal 140 and conditioning disk 138 may also rotate in the direction of arrow 148. Gimbal 140 and platen 122 may be rotated by motors (not shown) mounted at an outer end of respective swing arms 146, 126 and/or via a power transmission (e.g., belts, chains, etc.) extending through the swing arms. Similarly, platen 112 and polishing pad 120 may be rotated by motors (not shown) mounted at platen 112 and/or via a power transmission (e.g., belts, chains, etc.) coupled thereto.

Figure 6:
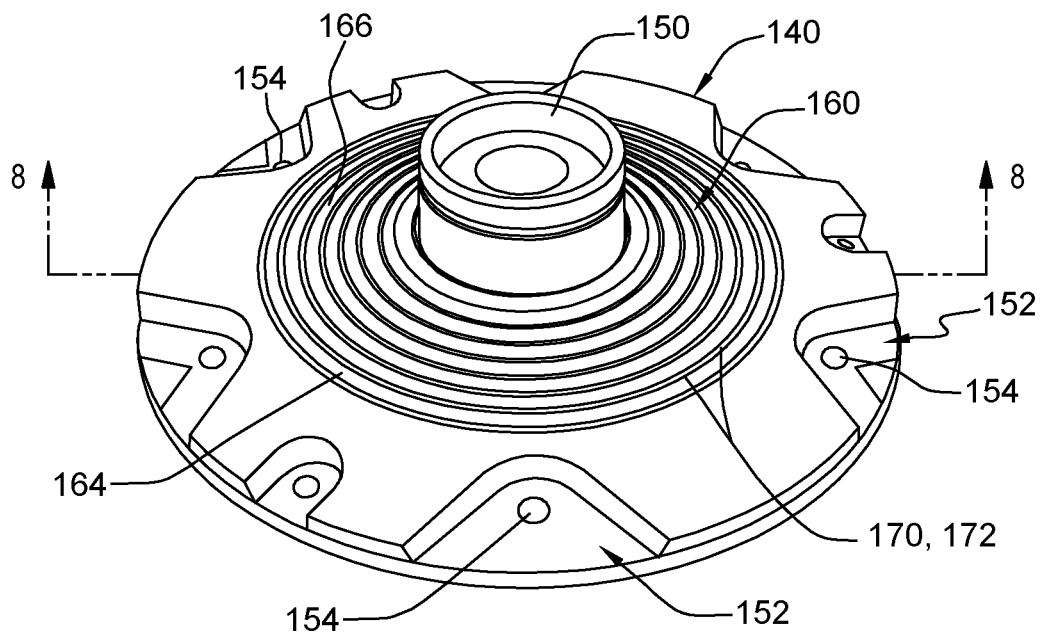
FIG. 6 shows a top perspective view of a gimbal for a conditioning system including a flexible metal diaphragm according to embodiments of the disclosure.
Figure 7:
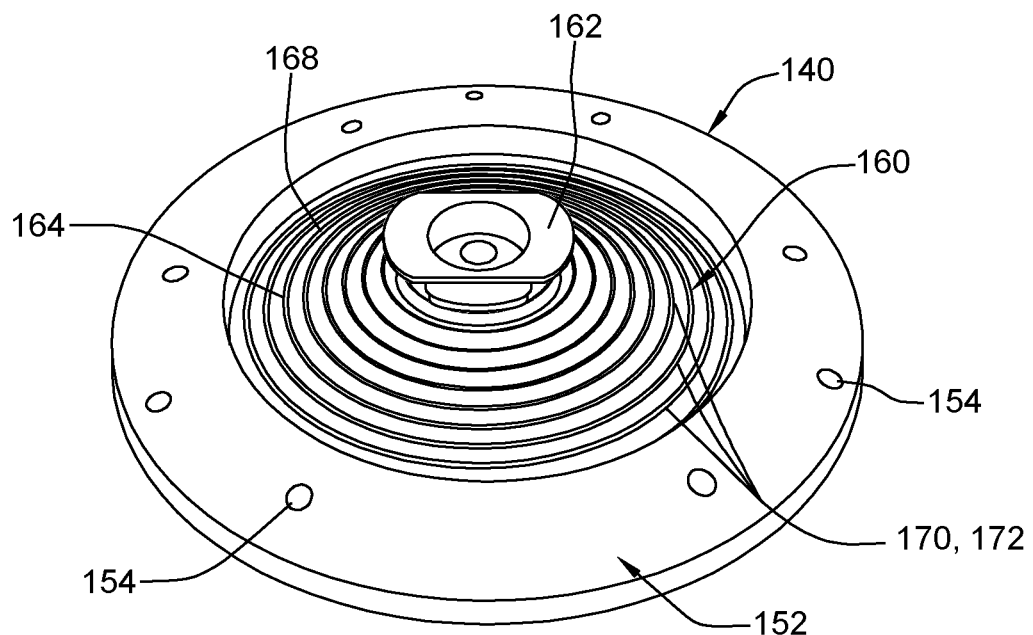
FIG. 7 shows a bottom perspective view of a gimbal for a conditioning system including a flexible metal diaphragm according to embodiments of the disclosure.
Figure 8:
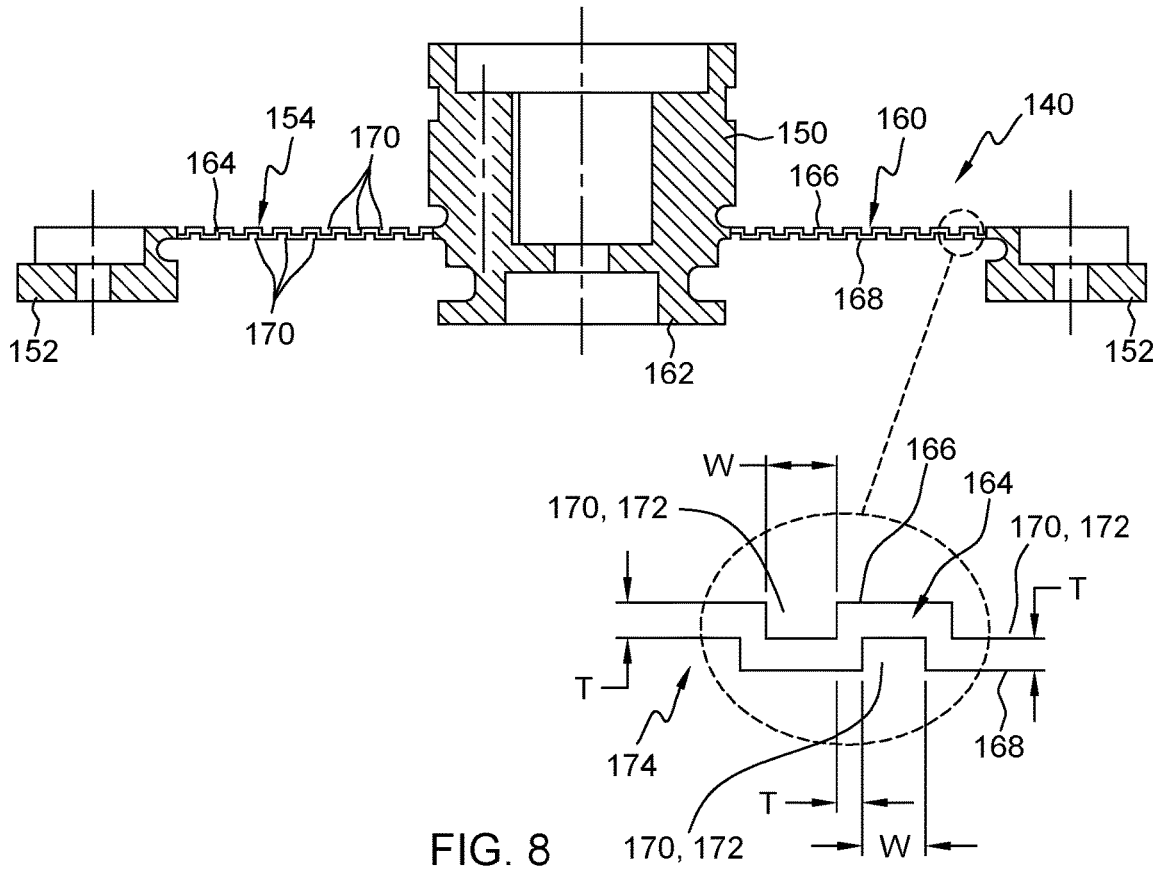
FIG. 8 shows a cross-sectional view along line 8-8 in FIG. 7.

Referring to FIGS. 6-8, embodiments of gimbal 140 according to embodiments of the disclosure are shown. FIG. 6 shows a top perspective view of gimbal 140, FIG. 7 shows a bottom perspective view of gimbal 140, and FIG. 8 shows a cross-sectional view of gimbal 140 through line 8-8 in FIG. 6. As shown, gimbal 140 may include an arm coupling 150 for coupling to conditioning swing arm 146 of CMP tool 110. Arm coupling 150 may include any now known or later developed coupling necessary to securely affix gimbal 140 to conditioning swing arm 146 and to allow rotation thereof. As shown, arm coupling 150 includes a bearing mount compatible with a bearing receiver (not shown) in conditioning swing arm 146. Gimbal 140 also includes a disk holder 152 for holding conditioning disk 138. Disk holder 152 may include any now known or later developed mechanism for holding conditioning disk 138. In the example shown, disk holder 152 includes a plurality of fastener openings 154 to allow fasteners (no shown) to mount conditioning disk 138 to disk holder 152. A variety of other forms of disk holder 152 are possible such as but not limited to magnetic couplings, grasping couplings, etc.

In contrast to conventional gimbals, gimbal 140 also includes a flexible diaphragm 160 extending between arm coupling 150 and disk holder 152. Flexible diaphragm 160 allows disk holder 152 to flex relative to arm coupling 150 so as to maintain disk holder 152 and conditioning disk 138 horizontal and the latter in contact with polishing pad 120. In accordance with embodiments of the disclosure, flexible diaphragm 160 is made of a metal or metal alloy. The metal or metal alloy may be any material capable of providing greater fatigue resistance than plastic, e.g., polytetrafluoroethylene, typically used for such gimbals. For example, flexible diaphragm 160 may be made of stainless steel, aluminum or other fatigue resistant metal or metal alloy. Further, the material is also capable of withstanding the environment of CMP tool 110, e.g., abrasives, chemicals, etc., and the torque applied during use. In this fashion, gimbal 140 provides the desired operational flexing to ensure constant contact between disk 138 and polishing pad 120, but better fatigue resistance compared to conventional gimbals with plastic flexure members. In one embodiment, disk holder 152 and arm coupling 150 are also made of metal or metal alloy, but this is not necessary in all instances. For example, they could be made of hard plastic so long as each is capable of withstanding the flexing of diaphragm 160, and the other environmental conditions noted above. In one embodiment, arm coupling 150, disk holder 152 and flexible diaphragm 160, i.e., all parts of gimbal 140, are integrally coupled as a unitary piece of metal or metal alloy. As shown in FIG. 7, gimbal 140 may also include a disk center support 162 on a bottom thereof. Disk center support 162 may support a center portion of conditioning disk 138, but is may not be necessary in all instances.

Flexible diaphragm 160 may include a wall 164 having an upper surface 166 and a lower surface 168 that creates a partition between points above and below it. Flexible diaphragm 160 also may include a plurality of rigidity weakening elements 170 in at least one surface 166, 168 of wall 164 that allow wall 164, and thus disk holder 152 and disk 138, to flex, i.e., relative to arm coupling 150 and polishing pad 120. Rigidity weakening elements 170 may take a wide variety of forms in the various embodiments of the disclosure, and can be customized to achieve any desired flexibility. For example, the number of rigidity weakening elements 170 may be selected to define a predetermined flexibility for flexible diaphragm 160, e.g., flexing but with sufficient back force to ensure the down force from conditioning swing arm 146 is transmitted to conditioning disk 138. Further, the shape of rigidity weakening elements 170 can also be varied to provide different flexibility. For example, the rigidity weakening elements 170 can be squared grooves (FIG. 8), rounded grooves (FIG. 9), V-shaped grooves (FIG. 10), among other shapes. As shown in FIG. 8, a thickness T of wall 166, and/or a depth (also T) and/or extent (W) of each rigidity weakening element 170 may also be customized to create the desired flexibility. In one example, rigidity weakening elements 170 may be selected to allow disk holder 152 to flex relative to arm coupling 150 in a range of approximately 0.1 to 3.0 millimeters, i.e., measured at any of a variety of radial locations on gimbal 140. The flex can be measured by the extent through which disk center support 162 moves from a relaxed position (e.g., as in FIG. 7) to a fully extended position (e.g., downwardly or upwardly, in the orientation as illustrated), i.e., with disk holder 152 on a flat surface and disk center support 162 able to move through a hole in the flat surface. The amount of flex can be measured in a static form, i.e., with no load thereon, or under a loaded condition, i.e., with a load attached.

Figure 9:
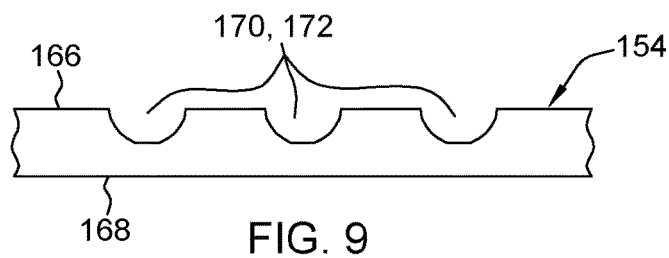
FIG. 9 shows a partial cross-sectional view of a wall of a flexible metal diaphragm of a gimbal according to another embodiments of the disclosure.
Figure 10:
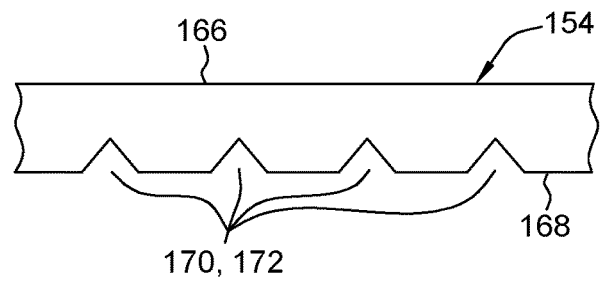
FIG. 10 shows a partial cross-sectional view of a wall of a flexible metal diaphragm of a gimbal according to another embodiment of the disclosure.

In the example of FIGS. 6-8, rigidity weakening elements 170 may include a plurality of concentric grooves 172 in at least one surface 166, 168 of wall 164. In FIGS. 6-8, concentric grooves 172 are in both surfaces 166, 168, so as to form a sinusoidal wall 174, as shown best in FIG. 8. Alternatively, FIG. 9 shows a partial cross-sectional view of wall 164 having concentric grooves 172 in only upper surface 166, and FIG. 10 shows a partial cross-sectional view of wall 164 having concentric grooves 172 in only lower surface 168. In any regard, weakening elements 170 allow flexible diaphragm 160 to flex, despite being made of metal or metal alloy. Wall 166 can thus act like a bellows or accordion wall.

Figure 11:
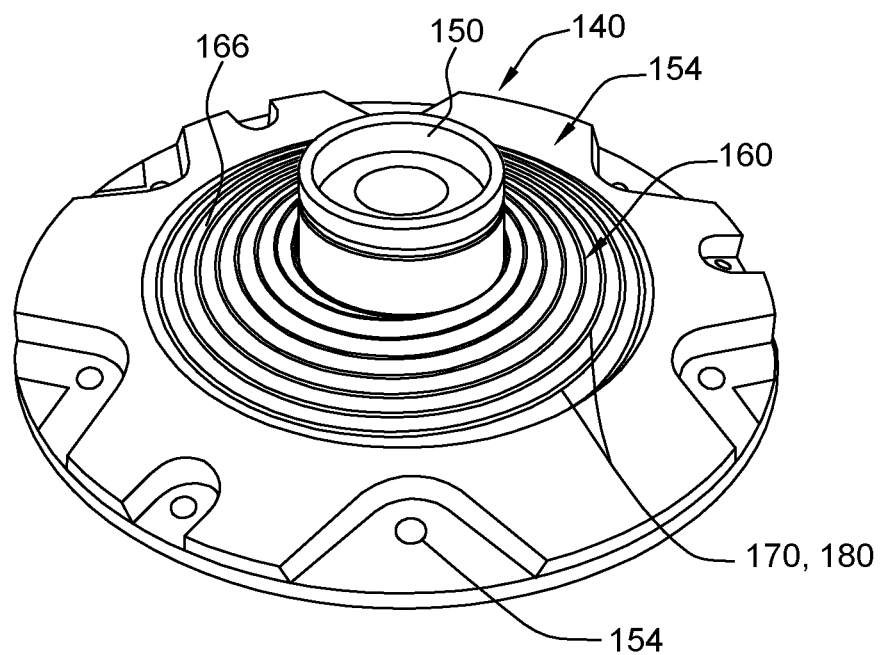
FIG. 11 shows a top perspective view of a gimbal for a conditioning system including a flexible metal diaphragm according to additional embodiments of the disclosure.
Figure 12:
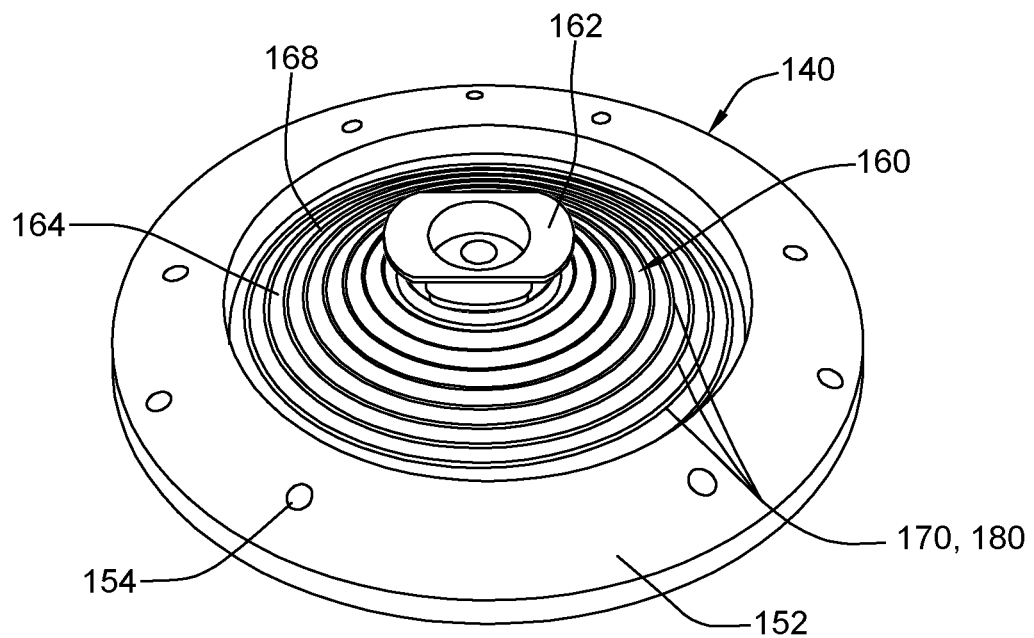
FIG. 12 shows a bottom perspective view of a gimbal for a conditioning system including a flexible metal diaphragm according to additional embodiments of the disclosure.

FIGS. 11 and 12 shows top and bottom perspective views, respectively, of another embodiment in which rigidity weakening elements 170 include at least one spiral groove 180 in at least one surface 166, 168 of wall 164. Although shown in both surfaces 166, 168, it is understood rigidity weakening element 170 can be in only one surface similar to concentric grooves 172 in FIGS. 9-10. The shape of spiral groove(s) 180 can be any described herein.

Figure 13:
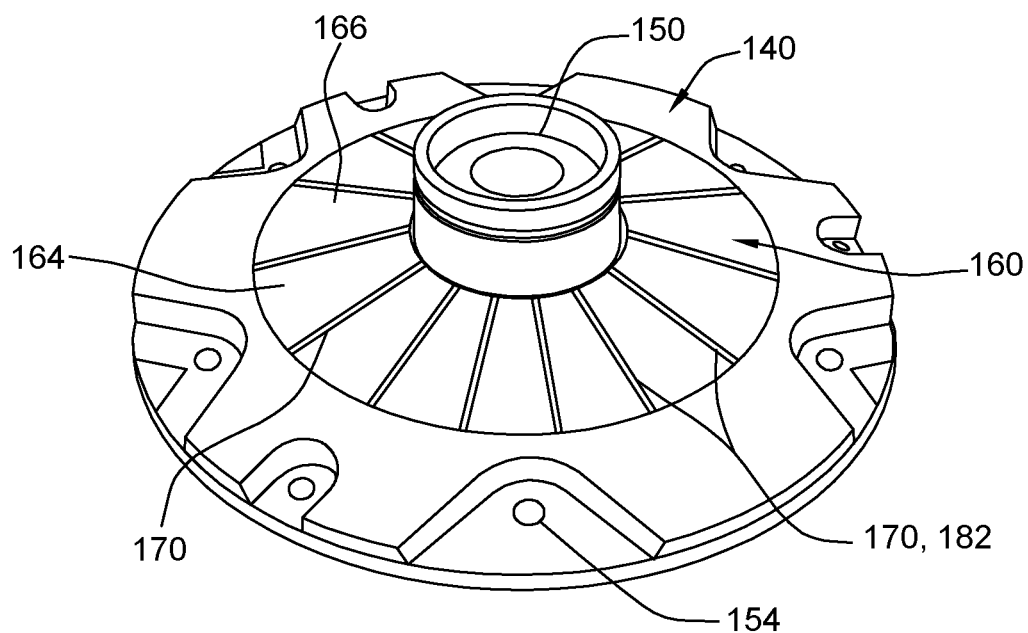
FIG. 13 shows a top perspective view of a gimbal for a conditioning system including a flexible metal diaphragm according to other embodiments of the disclosure.
Figure 14:
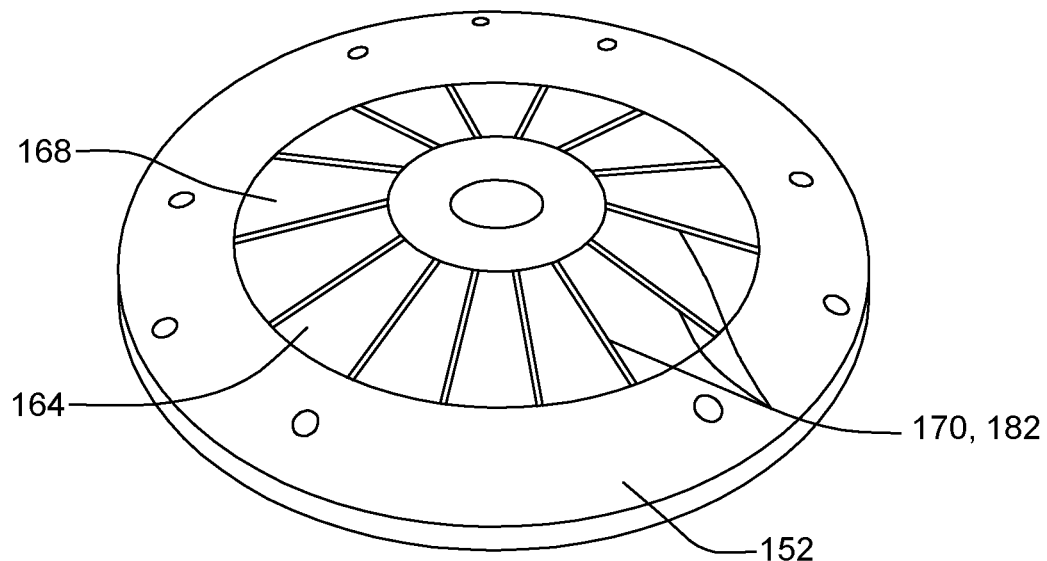
FIG. 14 shows a bottom perspective view of a gimbal for a conditioning system including a flexible metal diaphragm according to other embodiments of the disclosure.

FIGS. 13 and 14 shows top and bottom perspective views, respectively, of another embodiment in which rigidity weakening elements 170 include a plurality of radially extending grooves 182 in at least one surface 166, 168 of wall 164. Although shown in both surfaces 166, 168, it is understood rigidity weakening element 170 can be in only one surface similar to concentric grooves 172 in FIGS. 9-10. The shape of radial groove(s) 180 can be any described herein.

Figure 15:
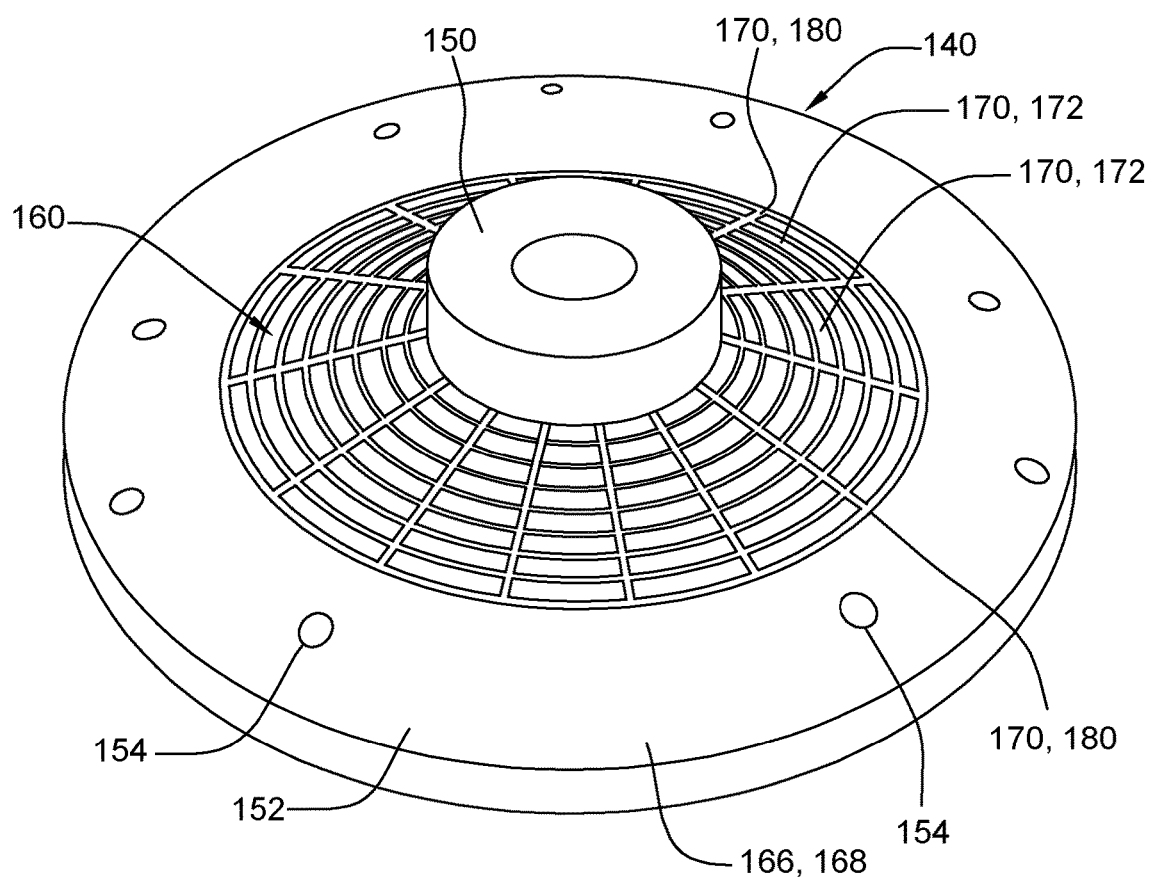
FIG. 15 shows a top perspective view of a gimbal for a conditioning system including a flexible metal diaphragm according to embodiments of the disclosure.

Embodiments of rigidity weakening elements 170, as described herein, each including grooves in at least one surface 166, 168 of wall 164 may be combined in any manner desired. Each groove may have at least one of a concentric, spiral or radially extending configuration. For example, FIG. 15 shows a partial perspective view of an embodiment in which rigidity weakening elements 170 include a plurality of radially extending grooves 180 with a plurality of concentric grooves 172 in surface 166 or 168 of wall 164. Although shown in one surface 166, 168, it is understood rigidity weakening element 170 can be in both surfaces similar to concentric grooves 172 in FIG. 8. The shape of each groove(s) can be any described herein.

Figure 16:
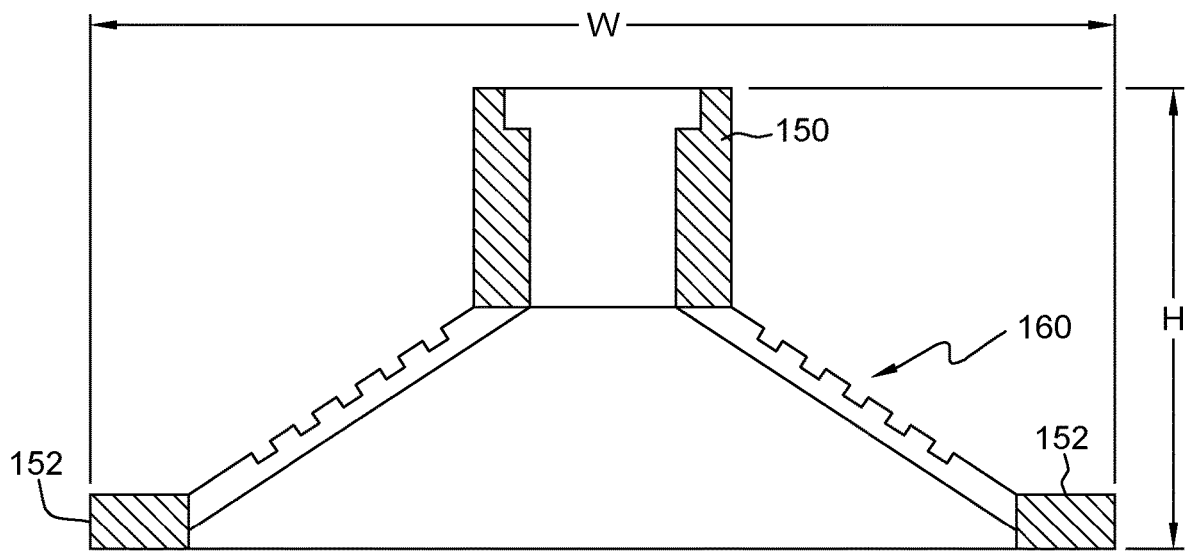
FIG. 16 shows a cross-sectional view of a gimbal for a conditioning system including a flexible metal diaphragm having a frustoconical shape, according to another embodiment of the disclosure.

As illustrated in the cross-sectional view of FIG. 8, wall 164 may be planar. In alternative embodiments, wall 164 can have other cross-sections such as but not limited to a frustoconical shape. See FIG. 16. Gimbal 140 may have any dimensions necessary depending on the size of conditioning swing arm 146, conditioning disk 138, etc. In one embodiment, shown for example only in FIG. 6, gimbal 140 may have a height H between 20 to 30 millimeters and a width W between 100 to 130 millimeters. Other sizes are possible.

Figure 17:
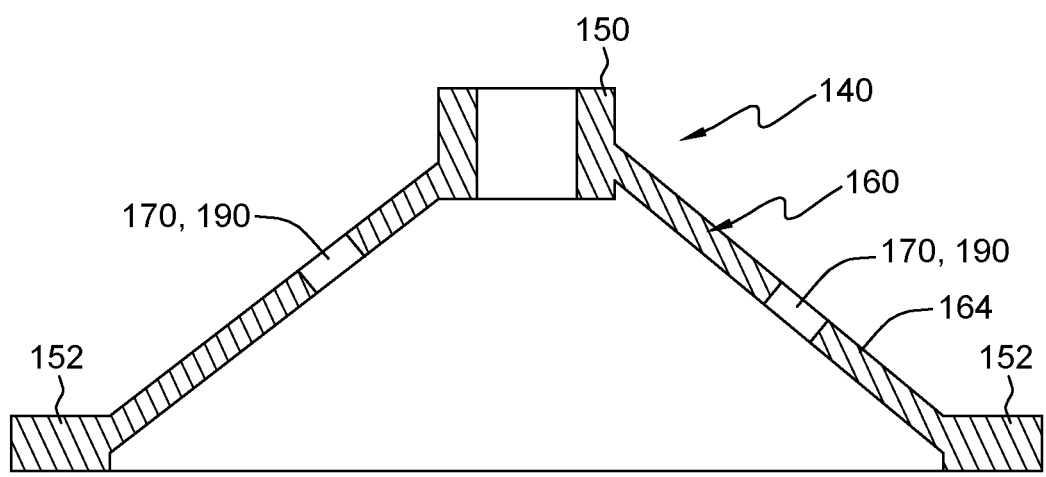
FIG. 17 shows a cross-sectional view of a gimbal for a conditioning system including a flexible metal diaphragm having a rigidity weakening elements in the form of opening(s) in a wall thereof, according to embodiments of the disclosure.

While shown with a solid wall 164, as shown in the cross-sectional view of FIG. 17, embodiments of the disclosure may also include flexible diaphragm 160 rigidity weakening elements 170 in the form of one or more opening(s) 190 in wall 164 thereof. Opening(s) 190 may be used alone or with any of the other rigidity weakening elements 170, described herein.

A CMP tool 110 including gimbal 140 as described herein can condition polishing pad 120 via the swing motion in conditioning swing arm 146 and gimbal 140 and rotation of gimbal 140 to current standards, i.e., with appropriate contact between disk 138 and pad 120, but with significantly less chance of fatigue breakage. The rigidity of rigidity weakening elements 170 can be customized to provide the desired flexibility overall in, and in particular locations of flexible diaphragm 160, to achieve the desired effect.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A gimbal configured to maintain a conditioning disk in contact with a polishing pad of a chemical mechanical planarization (CMP) tool, the gimbal comprising:
    an arm coupling for coupling to a conditioning swing arm of the CMP tool;
    a disk holder for holding the conditioning disk; and
    a flexible diaphragm extending between the arm coupling and the disk holder, the flexible diaphragm allowing the disk holder to flex relative to the arm coupling,
    wherein the flexible diaphragm is made of a metal or metal alloy and includes a wall including a plurality of rigidity weakening elements in at least one surface of the wall, each of the plurality of rigidity weakening elements having a respective depth that is less than a thickness of the wall, allowing the wall to flex.

2. The gimbal of claim 1, wherein the plurality of rigidity weakening elements includes a plurality of concentric grooves in the at least one surface of the wall.

3. The gimbal of claim 1, wherein the plurality of rigidity weakening elements include at least one spiral groove in the at least one surface of the wall.

4. The gimbal of claim 1, wherein the plurality of rigidity weakening elements include a plurality of radially extending grooves in the at least one surface of the wall.

5. The gimbal of claim 1, wherein the plurality of rigidity weakening elements includes a plurality of grooves in the at least one surface of the wall, each groove having at least one of a concentric, spiral or radially extending configuration.

6. The gimbal of claim 1, wherein the wall has a frusto-conical shape.

7. The gimbal of claim 1, wherein the plurality of rigidity weakening elements are in an upper surface and a lower surface of the wall.

8. The gimbal of claim 1, wherein the flexible diaphragm allows the disk holder to flex relative to the arm coupling in a range of approximately 0.1 to 1.5 millimeters.

9. The gimbal of claim 1, wherein the arm coupling, the disk holder and the flexible diaphragm are integrally coupled as a unitary piece of metal or metal alloy.

10. The gimbal of claim 1, wherein the flexible diaphragm is made of a material selected from the group consisting of: stainless steel and aluminum.

11. A conditioning system for a polishing pad of a chemical mechanical planarization (CMP) tool, the conditioning system comprising:
    a conditioning swing arm configured to swing and rotate a conditioning disk in contact with the polishing pad; and
    a gimbal configured to maintain the conditioning disk in contact with the polishing pad, the gimbal including an arm coupling for coupling to the conditioning swing arm, a disk holder for holding the conditioning disk, and a flexible diaphragm extending between the arm coupling and the disk holder, the flexible diaphragm allowing the disk holder to flex relative to the arm coupling,
    wherein the flexible diaphragm is made of a metal or metal alloy and includes a wall including a plurality of rigidity weakening elements in at least one surface of the wall, each of the plurality of rigidity weakening elements having a respective depth that is less than a thickness of the wall, allowing the wall to flex.

12. The conditioning system of claim 11, wherein the plurality of rigidity weakening elements includes a plurality of concentric grooves in the at least one surface of the wall.

13. The conditioning system of claim 11, wherein the plurality of rigidity weakening elements include at least one spiral groove in the at least one surface of the wall.

14. The conditioning system of claim 11, wherein the plurality of rigidity weakening elements include a plurality of radially extending grooves in the at least one surface of the wall.

15. The conditioning system of claim 11, wherein the wall has a frusto-conical shape.

16. The conditioning system of claim 11, wherein the plurality of rigidity weakening elements are in an upper surface and a lower surface of the wall.

17. The conditioning system of claim 11, wherein the arm coupling, the disk holder and the flexible diaphragm are integrally coupled as a unitary piece of metal or metal alloy.

18. The conditioning system of claim 11, further comprising a conditioning disk coupled to the disk holder.

* * * * *